United States Patent [19]

Chen et al.

[11] Patent Number: 5,340,700
[45] Date of Patent: Aug. 23, 1994

[54] METHOD FOR IMPROVED LITHOGRAPHIC PATTERNING IN A SEMICONDUCTOR FABRICATION PROCESS

[75] Inventors: Jang F. Chen, San Jose; James A. Matthews, Milpitas, both of Calif.

[73] Assignee: Microunity Systems Engineering, Inc., Sunnyvale, Calif.

[21] Appl. No.: 149,122

[22] Filed: Nov. 3, 1993

Related U.S. Application Data

[63] Continuation of Ser. No. 863,791, Apr. 6, 1992, abandoned.

[51] Int. Cl.$^5$ .................................................. G03C 5/00
[52] U.S. Cl. .................................. 430/312; 430/313; 430/319; 430/311
[58] Field of Search ................ 430/311, 312, 313, 319

[56] References Cited

U.S. PATENT DOCUMENTS 4,591,540  5/1986  Bohlen et al. ................... 430/22
4,835,088  5/1989  Gilsone ............................. 430/323

OTHER PUBLICATIONS

White, L. K.; "Contact Hole Imaging in Stepper Lithography", pp. 1–8, SPIE vol. 733 Optical Lithography VI (1987).
Ito et al.; "Submicrometer Pattern Correction for Optical Lithography" pp. 9–17, SPIE vol. 922 Optical/Laser Microlithography (1988).
Starikov, A.; "Use of a Single Size Square Serif for Variable Print Bias Compensation in Microlithography: Method, Design, and Practice", pp. 34–46, SPIE vol. 1088 Optical/Laser Microlithography (1989).
Chien, Paul et al.; "Proximity Effects in Submicron Optical Lithography": pp. 35–39, SPIE vol. 772 Optical Microlithography VI (1987).
Rosenbluth, Alan E. et al.; "A Critical Examination of Submicron Optical Lithography Using Simulated Projection Images"; pp. 1190–1195, J. Vac. Sci. Technol. B., vol. 1 No. 4, Oct.–Dec. 1983.
Nissan-Cohen, Y. et al.; "Variable Proximity Corrections for Submicron Optical Lithographic Masks"; pp. 13–14, Proc. 1987 Symp. VLSI Tech. (1987).
Meyerhofer, Dietrich; "Resolution and Proximity Effect in Optical Lithography": pp. 174–187, SPIE vol. 922 Optical/Laser Microlithography (1988).
Shamma, Nader et al.; "A Method for Correction of Proximity Effect in Optical Projection Lithography"; pp. 145–156, Proc. KTI Interface (1989).
Liu, Albert C. et al.; "A Study of Projected Optical Images for Typical IC Mask Patterns Illuminated by Partially Coherent Light"; pp. 1251–1263, IEEE Transactions on Electron Devices, vol. ED-30, No. 10, Oct. 1983.

(List continued on next page.)

*Primary Examiner*—John Kight, III
*Assistant Examiner*—Terressa Mosley
*Attorney, Agent, or Firm*—Burns, Doane, Swecker & Mathis

[57] ABSTRACT

A method of printing a sub-resolution device feature having first and second edges spaced in close proximity to one another on a semiconductor substrate includes the steps of first depositing a radiation-sensitive material on the substrate, then providing a first mask image segment which corresponds to the first edge. The first mask image segment is then exposed with radiation using an imaging tool to produce a first pattern edge gradient. The first pattern edge gradient defines the first edge of the feature in the material.

A second mask image segment is then provided corresponding to the second feature edge. This second mask image segment is exposed to radiation to produce a second pattern edge gradient which defines the second edge of the feature. Once the radiation-sensitive material has been developed, the two-dimensional feature is reproduced on the substrate.

22 Claims, 7 Drawing Sheets

OTHER PUBLICATIONS

Maxwell, Graeme D. et al.; "An Analysis of the Relevance to Linewidth Control of Various Aerial Image Characteristics"; pp. 213–223, SPIE vol. 633 Optical Microlithography V (1986).

Ong, Edith, et al; "Comparison of Proximity Effects in Contrast Enhancement Layer and Bi-layer Resist Processes"; pp. 443–448, J. Vac. Sci. Technol. B5 (1), Jan.-/Feb. 1987.

Flanner III, Philip D. et al.; "Two-Dimensional Optical Proximity Effects": pp. 239–244, SPIE vol. 633 Optical Microlithography V (1986).

Dunbrack, Steve K.; "Masks for Sub-0.5 micron Optical Lithography": pp. 2–8, SPIE vol. 922 Optical/Laser Microlithography (1988).

Wolf, T. M. et al.; "Proximity Effects of Lithography and Etching in Submicron Processes": pp. 335–349, Proc. KTI Interface (1989).

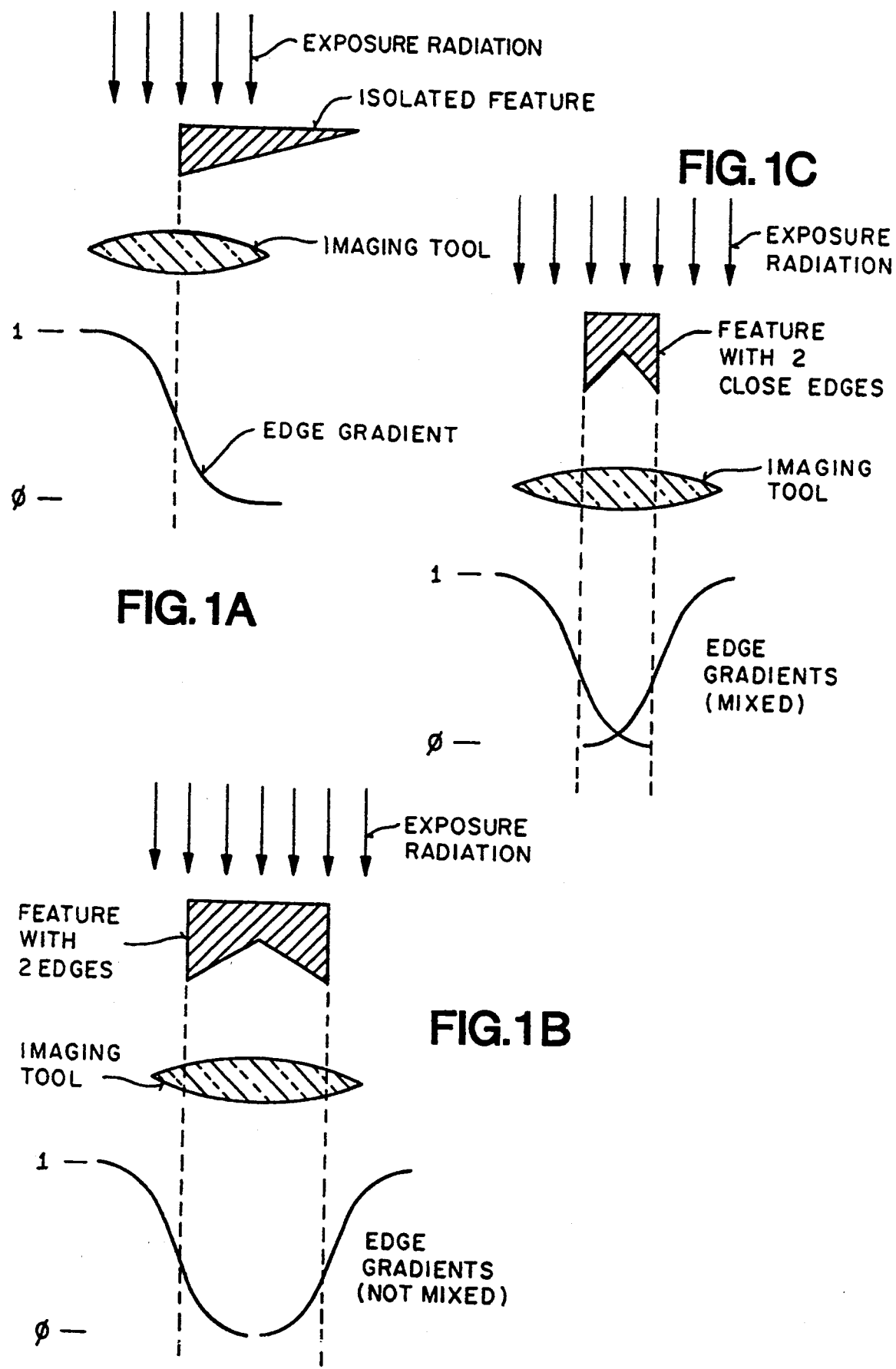

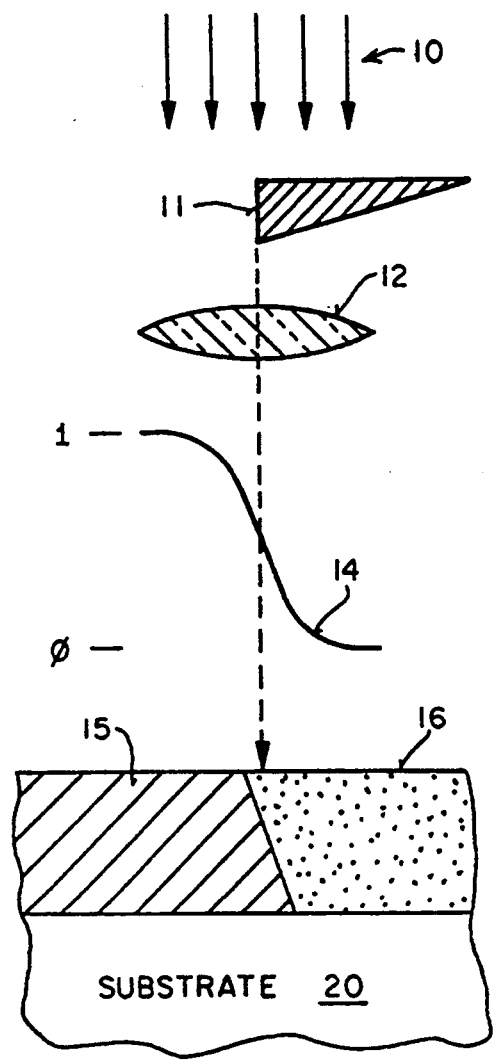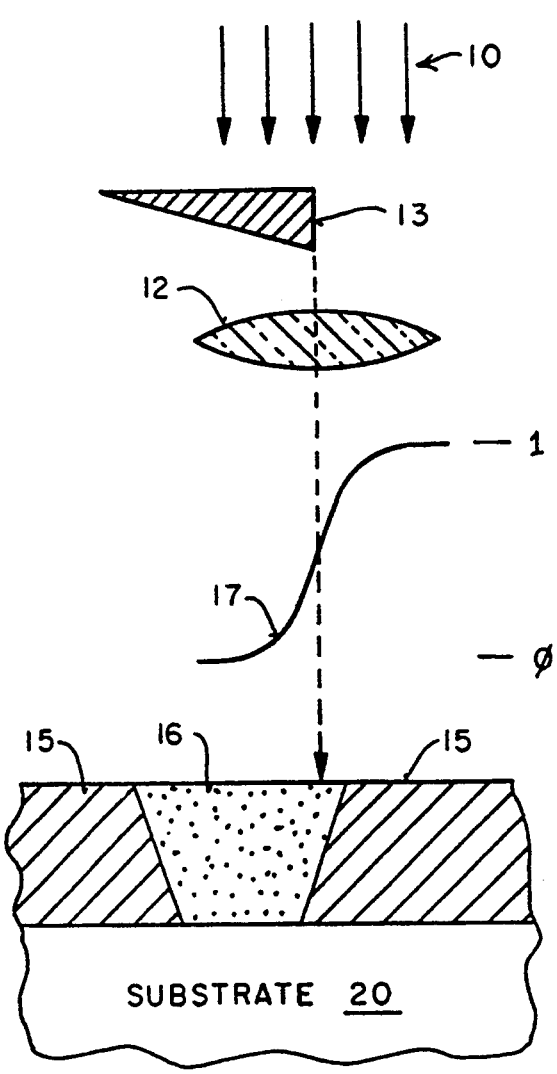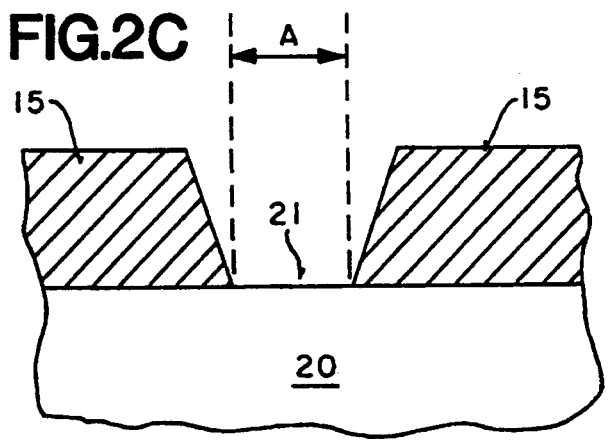

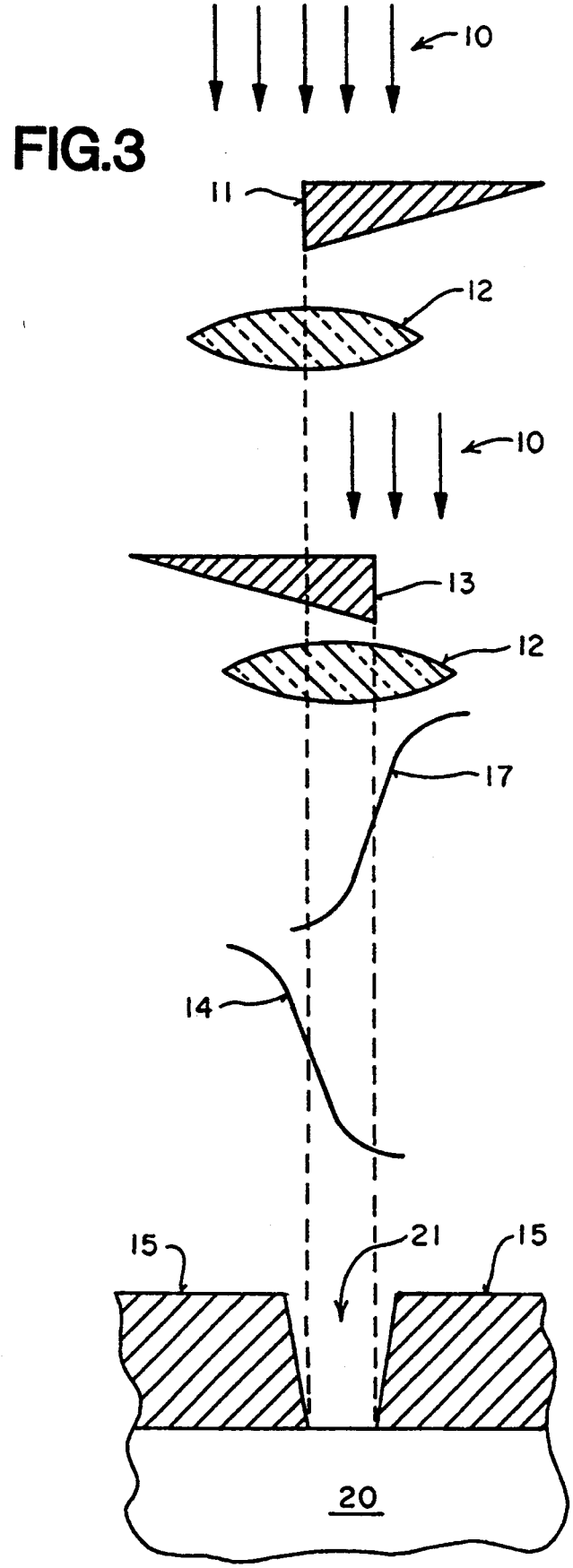

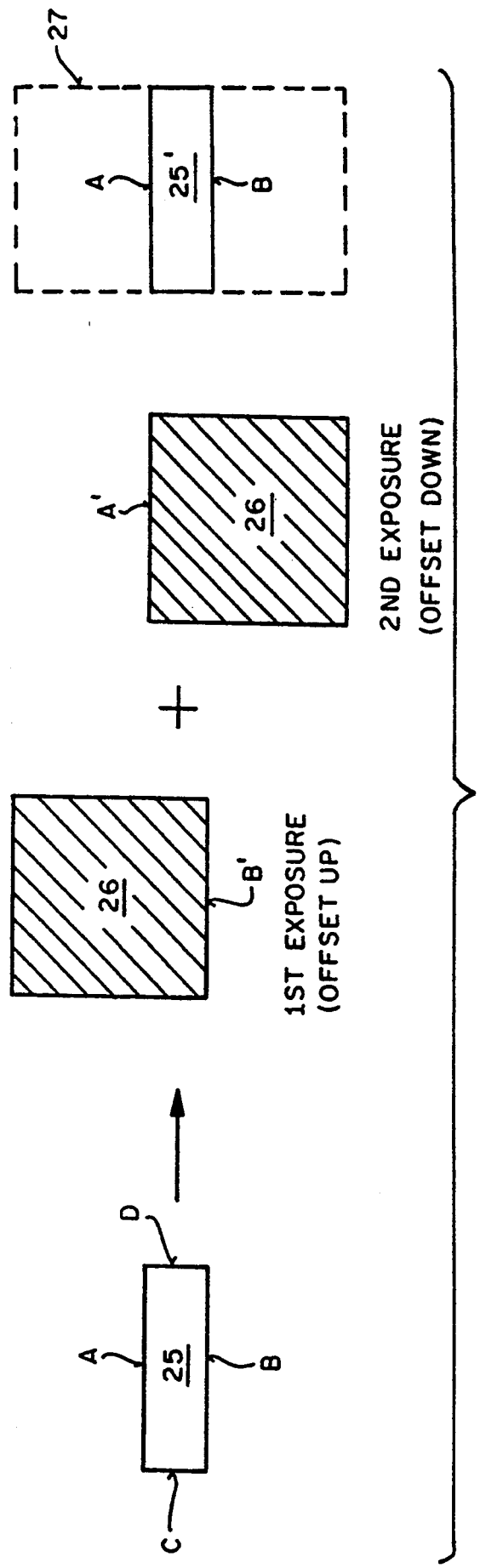
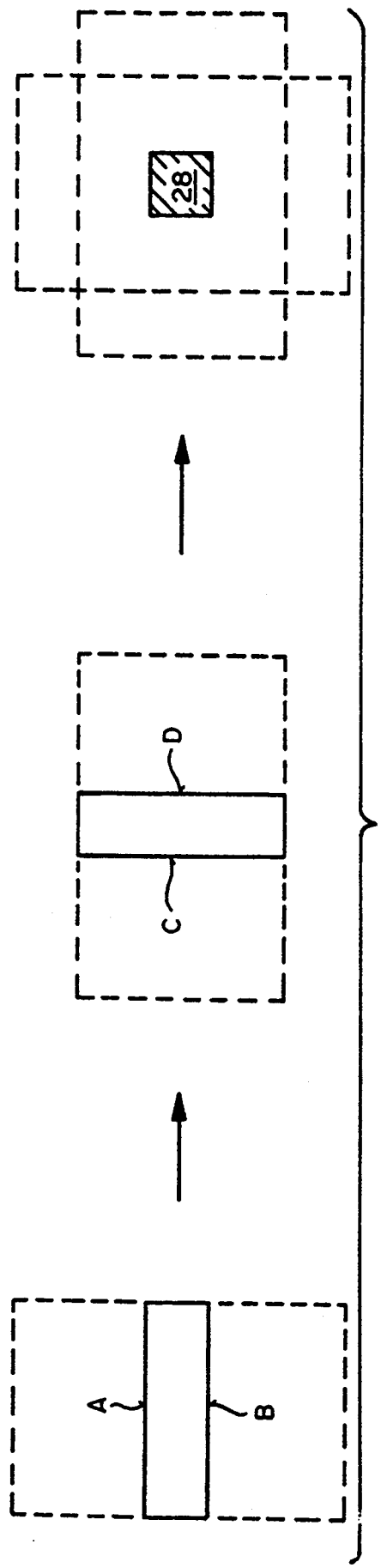
FIG.4
FIG.5

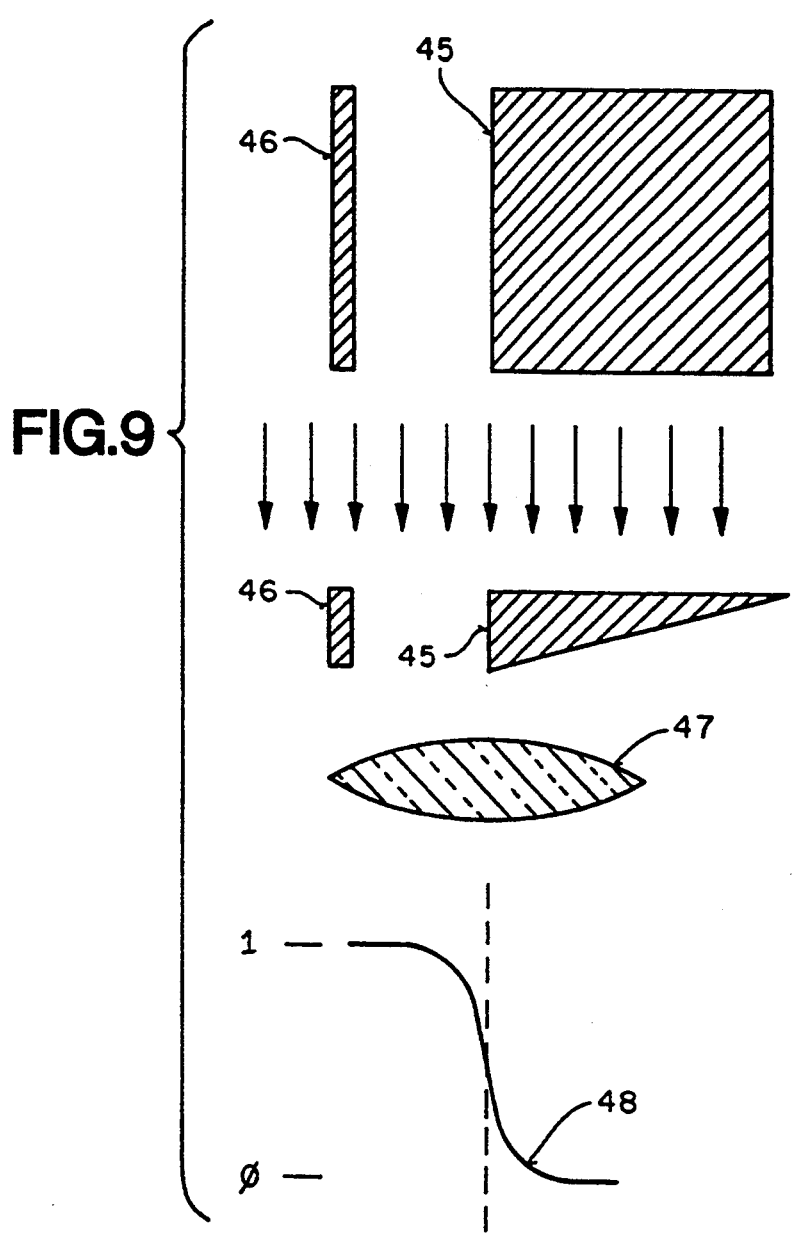
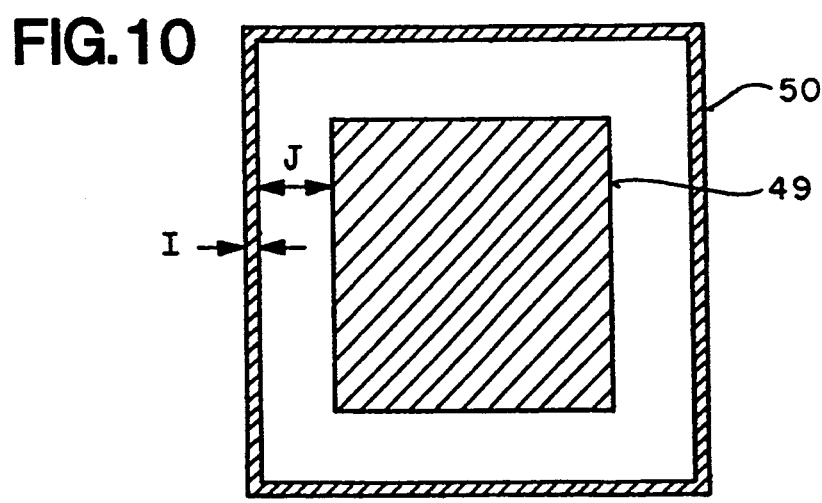

METHOD FOR IMPROVED LITHOGRAPHIC PATTERNING IN A SEMICONDUCTOR FABRICATION PROCESS

This is a continuation application of application Ser. No.07/863,791, filed Apr. 6, 1992 abandoned Feb. 23, 1993.

FIELD OF THE INVENTION

The present invention relates to the field of lithography; more specifically, to methods of manufacturing semiconductor integrated circuits by means of transferring mask patterns onto the surface of a silicon substrate.

BACKGROUND OF THE INVENTION

Lithography, as used in the manufacture of integrated circuits (ICs), involves the process of printing two-dimensional geometric shapes onto the surface of a semiconductor substrate. These shapes make up the parts of the circuit, such as the gate electrodes, contacts, vias, metal interconnects, and so on.

As part of the IC lithographic process, a radiation-sensitive material, such as photoresist, is usually applied to the silicon wafer and dried. The photoresist layer is then exposed using the proper geometrical patterns through a photomask by means of an imaging tool. The imaging tool utilizes some source of light or radiation to expose the mask. After exposure, the wafer is usually soaked in a solution that develops the exposed images in the photoresist. By way of example, these masking patterns provide a way of developing electrical contacts on the silicon substrate.

Quite commonly, the geometries used for fabricating IC devices are rectangular in shape. When printing rectilinear geometries, certain problems arise, particularly at the corner regions of the pattern. For example, during exposure to light or radiation the photoresist integrates energy contributions from all surrounding areas. This means that the exposure dose in one vicinity of the wafer is affected by the exposure dose in neighboring vicinities. This phenomenon is frequently referred to as the proximity effect.

Since a corner region in a photoresist pattern lacks neighboring regions, the exposure dose in a corner will always be less than the exposure dose delivered to the body or to an elongated side of the pattern. As a result, the corners of a developed photoresist pattern will actually be somewhat rounded, rather than square, due to the fact that less energy has been delivered to the corners than to the other areas of the masking pattern. In low density circuits where device geometries are large, corner rounding has a negligible effect on device behavior. However, in very large-scale integrated circuits (VLSI), where device structures are much smaller (e.g., submicron), rounding effects can wreak considerable havoc on the circuit's performance. For instance, rounding of electrical contacts reduces the total area available for conduction, thereby resulting in an increased contact resistance.

Table 1, shown below, illustrates how corner rounding can produce a loss of area in small contacts for a typical semiconductor process. Obviously, it is undesirable for any VLSI circuit to suffer from the detrimental effects of increased contact resistance resulting from a loss of contact area.

TABLE 1

| Design CD | Actual CD (in Resist) | Actual Feature Area Lost During Printing | % Area Loss |
| --- | --- | --- | --- |
| 0.60 μm | 0.577 μm | 0.099 μm² | 27.4% |
| 0.55 μm | 0.518 μm | 0.092 μm² | 30.4% |
| 0.50 μm | 0.371 μm | 0.142 μm² | 56.0% |
| 0.45 μm | 0.285 μm | 0.139 μm² | 68.5% |
| 0.40 μm | Not resolved | 0.160 μm² | 100% |

Another challenging task of the IC lithographic process is to print a two-dimensional feature, such as a contact mask, with feature sizes comparable to, or smaller than, the resolution limit to the imaging tool. Practitioners in the art understand that the resolution of an imaging tool is ordinarily defined as the minimum feature that the exposure tool can repeatedly print onto the wafer. By way of example, the resolution of a commercial imaging tool such as the ASM 5500/60 is around 0.47 microns. This means that as the critical dimensions of the mask features shrink—approaching the resolution limit of the lithographic equipment—the consistency between the mask layout and the actual layout pattern developed in the photoresist is significantly reduced. In fact, beyond a certain dimensional limit, some images are simply unresolvable (see, e.g., Table 1).

FIGS. 1A–1C illustrate this phenomenon. FIG. 1A shows an isolated feature edge illuminated by a light or a radiation source. After the illuminated feature edge is passed through the lense of the associated imaging tool, an image intensity edge gradient is produced on the substrate surface. This aerial edge gradient represents the change in image intensity from the fully illuminated regions to the completely dark or masked regions of the substrate.

FIG. 1B illustrates a feature having two close edges which are exposed simultaneously by an imaging tool. In accordance with the principles discussed above, each edge of the feature produces as its own aerial edge gradient with no diffraction at the edge separation shown. In other words, the adjacent edge gradients are not mixed due to the fact that the feature is completely resolvable by the imaging tool. Note that each edge gradient represents the characteristic of the imaging tool, which can be described by its numerical aperture (NA) and the exposure wavelength ($\lambda$) of the source radiation.

When the two feature edges are brought into close proximity during a single exposure, the two edge gradients begin to interact or diffract. At a certain minimum separation (shown in FIG. 1B), the two adjacent edge gradients still maintain their own identity. However, as the two edges are moved closer than the minimum resolvable separation of the imaging tool (as shown in FIG. 1C), diffraction causes a mixture of the edge gradients. The result is that the identity of each individual edge is lost. In other words, the combined aerial edge gradients are simply not resolvable.

The minimum separation that must be maintained in a lithographic process to avoid overlapping of edge gradients is defined by the Rayleigh limit (i.e., the resolution) of the imaging tool. Mathematically, the Rayleigh limit can be expressed as:

$$\text{Rayleigh limit} = k(\lambda/NA)$$

where k is an adjustable parameter dependent upon a variety of processing factors such as resist type. A typical value of k for a semiconductor production process is about 0.7. For a state-of-the-art imaging tool, such as the ASM 5500/60, $\lambda=0.36$ microns, $NA=0.54$, so that the minimum separation of two resolvable edges is approximately 0.47 microns. What this means is that this particular imaging tool is not useful for printing features that have critical dimensions or patterned edges which are spaced narrower than approximately 0.47 microns apart.

Based on the Rayleigh criterion, it is apparent that in order to improve the resolution of photolithographic processes, a new generation of imaging tools may need to be created. These tools would have to achieve higher numerical apertures and/or utilize new exposure sources having much shorter wavelengths. The problem, however, is that such improved imaging tools are not commercially available at present. Moreover, the development of such tools will require substantial investment of capital as well as considerable advances in existing imaging technologies. Alternative techniques such as exposure tuning, contrast enhancement layers, phase shift masking, and E-beam or X-ray technologies are currently either very costly or offer only minimal improvements in the resolution limit.

As will be seen, the present invention discloses a novel method of image decomposition which can be utilized in conjunction with existing imaging tools to radically improve the resolution limit of a lithographic process. The invented method is particularly well-suited for use in printing very small two-dimensional features such as contacts, vias, etc., on a semiconductor wafer. In addition, the invented method relieves the Rayleigh limit when imaging larger feature sizes and produces the desired two-dimensional patterns with much less complicated exposure routines as compared to prior art approaches. The net result is that the present invention markedly improves the overall lithographic process while extending the resolution limit far beyond that which is ordinarily achievable using standard imaging tools and techniques.

SUMMARY OF THE INVENTION

A method of improving the lithographic patterning process for semiconductor manufacturing is disclosed. According to the present invention, feature edges are decomposed by means of uncorrelated edge exposures, wherein two feature edges that are separated by less than the Rayleigh limit of the imaging tool are printed by means of separate exposure stages using a decomposed image mask.

Thus, one of the objects of the present invention is to overcome the aforementioned problems of prior art lithographic processes; especially when printing small features (e.g., device contacts).

Another object of the present invention is to facilitate the printing of sub-resolution two-dimensional patterns (i.e., below the Rayleigh limit of the associated imaging tool). This ability is realized without modifications to the imaging tools hardware elements.

Another object of the present invention is provide a simple lithographic method for printing orthogonal edges while minimizing rounding effects. The achieved result is a much more "squared" contact pattern—defined with significantly less two-dimensional shrinking problems.

Yet another object of the present invention is to provide a lithographic method wherein adjacent feature edges are printed in an uncorrelated fashion. In accordance with one embodiment of the invention, only one feature edge is effectively exposed at a time. One consequence of the invented method is that the effective depth of focus is comparable to those larger features that have completely uncorrelated edges.

It is still another object of the present invention to provide a lithographic processing method which is capable of benefiting from future improvements and advancements in the imaging tool technology field. As newer, better-performing lithographic tools are created, the present invention is capable of exploiting this new technology to the fullest extent. This means that through the use of the present invention, the resolution limit of an imaging tool can always be improved.

It is another object of the present invention to provide a method which may be combined with advanced resist process technology to further extend the resolution limit of the lithographic system.

It is still another object of the present invention to provide an image decomposition algorithm which can be integrated into current computer aided design (CAD) tools to become an automated procedure for use in a lithographic process. In such a case, the decomposition process becomes transparent to the integrated circuit designer. Furthermore, using the image decomposition algorithm of the present invention permits, image offset exposure information to be generated and supplied directly to the stepper machine. Again, this process can be carried out transparent to on-line operators in order to minimize handling errors and further improve the manufacturing process of semiconductor wafers.

BRIEF DESCRIPTION OF THE DRAWINGS

FIG. 1A–1C illustrate the problems which arise in optical lithography as device features shrink.

FIGS. 2A–2C illustrates the basic concept of decomposing features using uncorrelated edges.

FIG. 3 further illustrates how the concepts shown in FIG. 2 can be combined to produce a minimum-sized contact opening.

FIG. 4 is an example showing how the method of the present invention can be utilized to print a two-dimensional feature having two edges which are smaller than the resolution limit of the imaging tool.

FIG. 5 shows how the concept presented in the diagram of FIG. 4 may be extended using additional exposure steps to produce even smaller feature sizes.

FIG. 9 illustrates a method of improving the optical resolution by changing the aerial image gradient of a feature edge.

FIG. 10 shows a decomposed image with intensity leveled edges.

DETAILED DESCRIPTION

Figure 6:
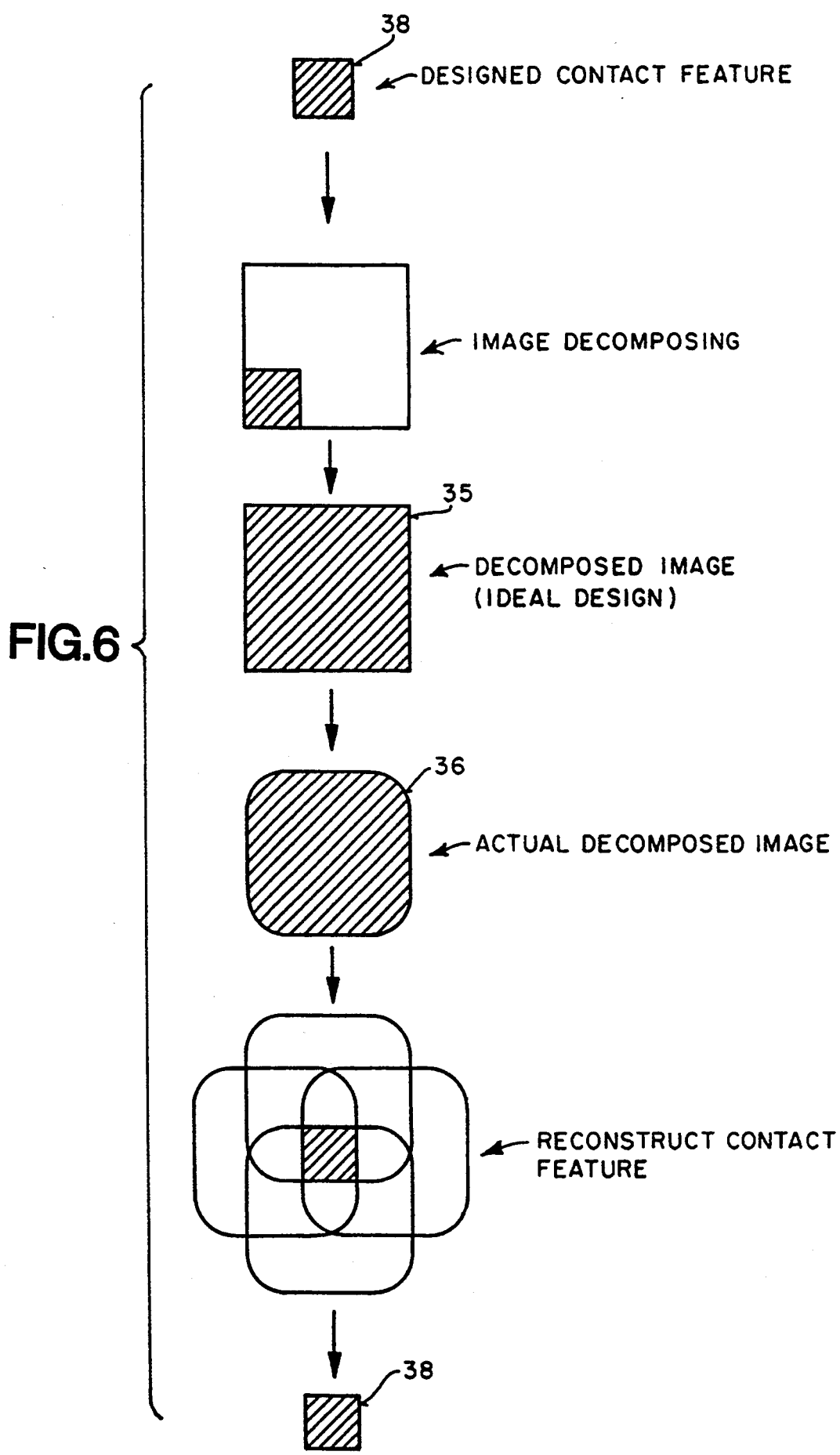
FIG. 6 illustrates a process whereby a designed contact feature is constructed utilizing the image decomposition method of the present invention.

A method for improving the lithographic patterning process in the fabrication of semiconductor devices is disclosed. The invented method is characterized by its applicability to all forms of optical lithography, laser and non-laser based deep ultraviolet (UV) lithography, X-ray lithography, as well as particle beam based lithography. In the following description, numerous specific details are set forth, such as specific tools, dimensions, material types, etc., in order to provide a thorough understanding of the present invention. It will be obvious, however, to one skilled in the art that these specific details need not be employed to practice the present invention. In other instances, well known processing steps have not been described in detail in order not to avoid unnecessarily obscuring the present invention.

The basic concepts of the present invention avoid the restrictions of the Rayleigh limit when printing small two-dimensional features by means of multiple uncorrelated exposures. In conventional lithographic methods, two or more edges of a feature are defined by presenting them simultaneously in very close proximity during mask exposure. These edges, which appear on the same masking layer, are said to be correlated pattern edges. Upon exposure, the two correlated edges produce aerial edge gradients which are diffracting, and thus, are not resolvable. But if the two edges are spaced far enough apart, or decomposed into separate masking layers or exposure steps, no defraction occurs during exposure. In this latter case, the two edges are said to be uncorrelated.

In the method of the present invention, only one patterned edge is defined at a time when producing small two-dimensional features. In the first exposure, one of the edge features is exposed. In the second exposure, a different edge is exposed. In one embodiment, this second exposure is performed using the same mask image that was used for the first exposure, however, for the second exposure the mask is offset by a predetermined distance from where the first edge was imaged. During the second exposure, the area previously exposed is generally protected from further exposure.

After the photoresist has been developed, a resist pattern is produced which yields two edges spaced in close proximity. Since the two edges were not presented together at the same time as part of the same exposure step, they can be printed at an arbitrary separation while avoiding the adverse effects of diffraction. Printing feature edges by means of separate exposure stages or masking layers is referred within the context of this application as uncorrelated edge exposure.

FIG. 2A–2C illustrates how separated exposure stages can be utilized to define patterns having narrowly spaced edges. The great advantage of this approach is that the separation between the edges can be much less than the Rayleigh limit without diffraction of an adjacent aerial edge gradient. In FIG. 2A, radiation 10 from an imaging tool 12 is employed to expose a first feature edge 11. This exposure produces an edge gradient 14 that exposes a resist layer formed over a semiconductor substrate 20. In the case of FIG. 2, a negative resist is used, resulting in an exposed resist area 15 and an unexposed area 16. In a negative-acting resist system, exposed area 15 becomes insoluble to the resist developer while the unexposed area 16 is unchanged (i.e., area 16 maintains a solubility in the developer solution). Note that modern negative-acting resist systems are capable of resolving sub-half-micron lines and spaces.

In the second exposure stage shown in FIG. 2B, a second feature edge 13 is utilized together with imaging tool 12 to produce edge gradient 17. Feature edge 13 is intentionally offset relative to substrate 20 to produce the desired critical dimension in the photoresist layer. After the second exposure in the sequence, there is only a single unexposed area 16 surrounding on adjacent sides by exposed areas 15. After resist development, unexposed area 16 is developed away to leave an opening 21 having a dimension width "A", which may be considerably less than the Rayleigh limit of the imaging tool 12 (see FIG. 2C).

FIG. 3 shows the method of FIGS. 2A–2C, superimposed into a single processing sequence. This sequence is more clearly illustrates how the use of uncorrelated edge exposures produces the designed feature size, whereas exposing both edges 11 and 13 simultaneously would result in an unresolvable image. It should be understood that the two-dimensional feature of either FIGS. 2A–2C or 3 may be printed using either a single masking image that is offset for each exposure, or alternatively, using two separate masking images which are aligned differently with respect to substrate 20.

To fabricate large arrays of two-dimensional features (such as contact openings), a systematic structure must be created in which the masking image has a large enough dimension so that its edges remain uncorrelated, yet are resolvable. In accordance with the present invention, this requirement is satisfied by a method called "image decomposition." This method is illustrated using a negative system in the examples of FIGS. 4 and 5.

FIG. 4 illustrates how a rectangular feature 25 is decomposed into a larger square mask image 26, and how mask image is then used to reproduce feature 25 on a silicon substrate. Feature 25 represents a designed feature which is to be patterned onto the substrate surface. It includes two relatively long edges (labelled "A" and "B") which are orthogonal to two relatively short edges (labelled "C" and "D"). (In the example of FIG. 4, assume that edges A and B are separated by a distance which is less than the Rayleigh limit of the imaging tool being used. Also assume that edges C and D are separated by a distance which is larger than the Rayleigh limit.)

In the first stage of exposure, decomposed mask image 26 is aligned in a manner such that edge B' matches the location of edge B as will be printed on the substrate. This first edge is exposed as described above. In the second exposure stage, decomposed mask image 26 is offset, or shifted down relative to the first exposure, so that edge A' matches the position of edge A of feature 25. Note that in this example, short edges C and D are not a concern because they are separated by a distance which is beyond the Rayleigh limit. Since edges A and B are defined independently using two separate exposure stages (in this case, utilizing the same decomposed image), the aerial gradients cannot diffract. Hence, the small two-dimensional design feature is reproduced without the proximity or resolution difficulties experienced in the prior art.

Extending the procedure of FIG. 4 to one which includes additional offsets to the left and to the right using the same decomposed mask image 26, a final feature 28 may be reproduced having an area that is considerably smaller as compared to the original exposed feature. This approach is illustrated diagramatically in FIG. 5. Note that the process which produces feature 28 requires a total of four exposure stages, rather than the two needed in the example of FIG. 4. Because the four edges of the reproduced feature have dimensions far below the resolution of the imaging tool, each of the four edges of feature 28 are defined independently. As explained earlier, each of the multiple exposure stages required to print a device contact such as feature 28, can be carried out either through the use of multiple masks, or by using a single mask (having a suitable decomposed image) that is approximately offset for each exposure. Thus, the invented method allows the printing of the sub-resolution device features in a semiconductor process.

Because contact features are normally designed to have a square shape, it is convenient to decompose these features into larger square shapes. The edge size or critical dimension (CD) of the decomposed image, however, must be long enough to avoid the proximity effect previously described. Otherwise, severe corner rounding would yield a reconstructed contact feature having a circular, or less than square, shape.

Recall that a square contact size is preferred since it has a lower contact resistance as compared to contacts having rounded corners. FIG. 6 illustrates how a designed contact feature 38 may be decomposed to a larger masking image 35 in order to reconstruct the final contact feature 38 on a semiconductor substrate. Notice that while the masked or ideal decomposed image 35 has square corners, the actual decomposed image 36 that is printed during each exposure stage suffers from corner rounding because of the proximity effect. Therefore, the key to printing a square contact is to optimize the critical dimension of the decomposed image 35 such that rounding effects are avoided in the final reconstructed feature. In other words, the smallest printable contact feature using the invented method is limited by the available straight edge dimension of the decomposed image square and the optical intensity gradient of that edge.

Figure 7:
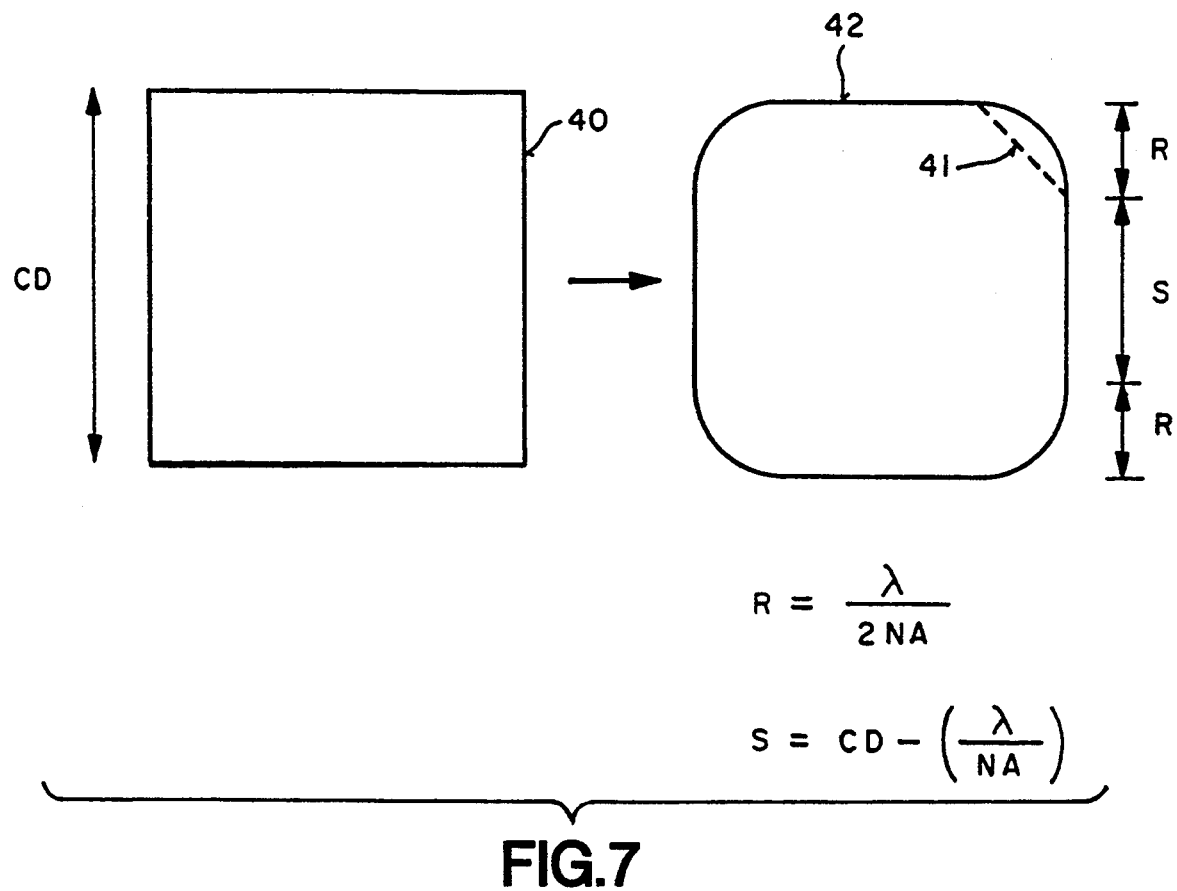
FIG. 7 illustrates the derivation of the straight edge dimension for a designed square feature.

It is observed that the corner rounding of a square resist feature is directly related to the Rayleigh criterion. This relationship is described in FIG. 7. FIG. 7 illustrates a square, decomposed image 40 having an edge length CD, where CD represents the design critical dimension for the decomposed square image. When this image is actually printed using a standard resist process, the actual decomposed image 42 exhibits rounded corners. The radius of each rounded corner is represented in FIG. 7 by the dimension R. The straight edge dimension of the resist pattern, S, is calculated to be $$S = CD - (\lambda/NA).$$

This equation also points out that if the critical dimension of the design is less than $(\lambda NA)$ of the associated imaging tool being used, then a straight edge will not be produced. That is, the square, design contact feature will be printed with rounded corners. In extreme cases, the design feature may not be printed at all.

Thus, the relationship of FIG. 7 can be used to predict to the minimum CD needed for the decomposed image. For example, if the design calls for 0.3 micron contact opening using a commercially available stepper with the parameters $\lambda = 0.365$ microns, $NA = 0.54$, then the CD for the decomposed square image is calculated to be 0.973 microns. This means that a decomposed mask image having an approximate one micron CD is needed in order to properly define a 0.3 micron square contact when employing the invented method.

Figure 8A:
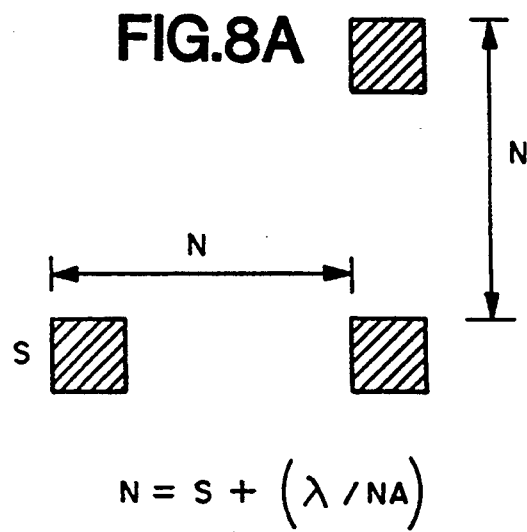
FIGS. 8A and 8B show the minimum pitches needed, as calculated in both orthogonal and diagonal directions, for an array of contacts.
Figure 8B:
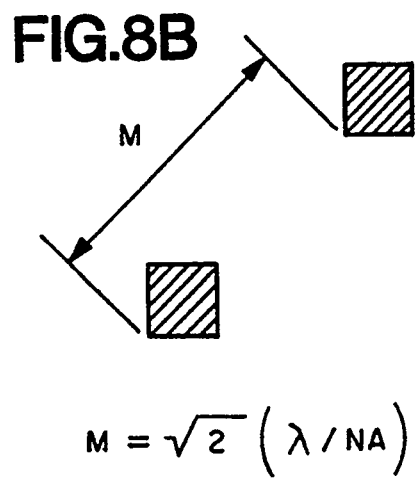

Because the decomposed image or mask segments are always larger than the designed feature, and because multiple exposures are needed in the presently invented method in order to delineate each contact, certain pitch limitations arise. For example, during each edge exposure the decomposed image must be offset accordingly (or separate mask layers employed). Any offsetting step affects the area surrounding the printed contact feature. Since it has been exposed, this area is rendered unusable for the creation of other contact features. Based on these considerations, the minimum separations required for neighboring contact features are given by the equations below, as well as shown graphically in FIGS. 8A and 8B. Note that in each case, S is defined as the final target contact size, N is defined as the minimum horizontal or vertical pitch, and M is defined as the minimum diagonal pitch.

$$N = S + (\lambda/NA) \text{ (or, } N = CD\text{)}$$

$$M = \sqrt{2} \, (\lambda/NA)$$

Having thus far described the individual steps required for printing sub-resolution features in accordance with the present invention, a general image decomposition algorithm for producing a contact array mask is now described. This algorithm is preferably integrated into existing CAD tools, so that it is implemented as an automatic procedure during the lithographic process. The algorithm comprises the following comprehensive steps. (It is appreciated that not all of these steps may be required depending upon the particular process or application employed).

A) Determine the final contact mask size S, as required for the design;

B) Calculate the minimum CD required for the decomposed image square by using the relationship $CD = S + (\lambda/NA)$;

C) Form the decomposed image or images based on each contact;

D) Determine the steps (e.g., image offset and exposure stages) required to decompose the final feature;

E) Determine the peripheral area surrounding each contact that will be affected by the decomposing process;

F) Calculate the minimum pitches N and M for the vertical, horizontal and diagonal directions (where $N = CD$ and $M = \sqrt{2}(\lambda/NA)$).

G) Verify that all contacts are separated by at least more than the minimum pitches.

H) If none of the pitch rules are violated, then form the decomposed mask or masks.

I) If adjacent contacts have a pitch which is less than the minimum required, then remove one of the neighboring contacts from the current decomposed mask to a second decomposed mask;

J) Generate a second decomposed mask to accommodate the removed contacts from the previous step, keeping the same relative location;

K) Recheck the pitch rules once again to ensure that both masks have no violations;

L) Form the decomposed image mask for each contact mask;

M) Generate the corresponding exposure routine information (e.g., offsets, mask changes, etc.).

As described by the above algorithm, when a contact mask has a tighter design pitch than is allowed by the design rules, at least two decomposed sub-masks must be created. This is indicated in steps I-M. The two sub-masks must then be combined in the final processing sequence in order to print the full contact array.

It should be understood that the above-described decomposition algorithm is applicable to both clear and dark field masks. It has been observed that the clear field mask has certain advantages which include fewer pitch restrictions and lack of concern about involuntarily exposing areas. Accordingly, a negative-acting resist process is employed in the currently preferred embodiment. For dark field masks, an extra mask is often needed to account for involuntarily exposed areas.

Since the present invention relies upon multiple exposure stages, it should also be understood that misplacement of any edge can affect the total CD control of the final feature. However, commercial imaging tools are presently available with stage movements having precisions of approximately 0.005 microns. This high level of precision—combined with the fact that in the present invention image offsets are generally in close proximity to the original exposure—means that the overall impact of the lithographic tool's precision is negligible. Moreover, utilizing the uncorrelated edge exposure method of the present invention permits the depth of focus to be much greater than that of conventional printing methods. It is believed that any CD error induced by the stage precision of the hardware is more than compensated by the gain of having a more favorable depth of focus.

Indeed, the results shown below in Table 2 indicate that the present invention is capable of achieving remarkably "square-like" contact features with 0.25 micron dimensions.

TABLE 2

| Target CD | Actual CD (In Resist) | Actual Feature Area Lost | % Area Lost |
|---|---|---|---|
| 0.50 μm | 0.492 μm | 0.048 μm² | 19.0% |
| 0.40 μm | 0.408 μm | 0.034 μm² | 21.0% |
| 0.30 μm | 0.309 μm | 0.020 μm² | 22.0% |
| 0.25 μm | 0.261 μm | 0.015 μm² | 24.0% |

These results are then all the more astounding when one considers that the imaging tool and resist process employed (an ASM 5500/60, with a Shipley resist SNR 248 process) is barely capable of resolving 0.45 micron with more contacts than 60% of loss in area using a standard printing method (see Table 1). With the invented method, the same tool now yields contacts as small as 0.25 microns with less than 25% area loss—thus, effectively doubling the resolution performance of the exposure tool.

The smallest printable dimension using the decomposition method described thus far described is ultimately limited by the intensity edge gradient produced by the imaging tool and the resist process. However, a further improvement can be made to the presently invented method by the addition of specialized lineations placed in close proximity to the feature edge. A mask which incorporates such lineations, also known as "intensity leveling bars", is disclosed in co-pending application entitled "Improved Mask for Photolithography", Ser. No. 07/821,793, filed Jan. 16, 1992, which application is assigned to the assignee of the present invention.

Intensity leveling bars perform the function of increasing the slope of the intensity edge gradient, in order to improve the resolution of the imaging system. The leveling bars themselves consist of very thin lines or features placed parallel to isolated edges of the feature. Each leveling line has a dimension which renders essentially unresolvable by the imaging tool. However, its function is not to be printed onto the substrate, but rather to affect the contrast of the adjacent feature edge so that the aerial image gradient of the intensity leveled feature edge has a steeper slope as comparable to the normal edge gradient.

FIG. 9 illustrates the use of an intensity leveling bar 46 in conjunction with the printing of feature edge 45. The width of leveling bar 46 is preferably on the order 0.1 microns wide. The essential characteristic of intensity leveling bar 46 is that it be unresolvable by the imaging tool; that is, bar 46 must be narrow enough so as not to be printed during the exposure of feature edge 45. FIG. 9 illustrates that upon exposure by imaging tool 47, an edge gradient 48 is produced which is characterized by a steeper slope. This steeper edge gradient slope translates into improved imaging resolution.

Table 3 illustrates, by way of example, the astounding results achieved utilizing the decomposition method described earlier in conjunction with intensity leveling bars.

TABLE 3

| Target CD | Actual CD (In Resist) | Actual Feature Area Lost | % Area Lost |
|---|---|---|---|
| 0.20 μm | 0.198 μm | 0.0090 μm² | 22.8% |
| 0.10 μm | 0.095 μm | 0.0021 μm² | 21.0% |

As can be seen, the present invention allows the printing of contacts having a feature size as small as 0.1 microns wide utilizing the same imaging tool and resist process as found in Table 1. (Note that the results of Table 3 were produced using an adjusted resist thickness of ~0.3 microns.) It is remarkable that even at these very small dimensions, the percent of area loss due to corner rounding is minimal (approximately 20%).

FIG. 10 illustrates an example of a decomposed square image 49 with an intensity leveled lineation 50. Intensity leveling lineation 50 has a width which is less than the resolution capability of the imaging tool. Currently, the dimension or width, I, of the intensity leveling bar is preferably one-fifth of the associated imaging tool's resolution. This is represented mathematically by the equation $$I = (1/5)\text{Rayleigh limit} = (0.2k)(\lambda/NA)$$

The separation, J, between the decomposed image and the intensity leveling lineation is preferably about 1.1 times the imaging tool's resolution. Again, this is expressed by the equation:

$$J = (1.1)\text{Rayleigh limit} = (1.1k)(\lambda/NA)$$

We claim:

1. In a method for lithographically transferring a pattern from a mask into a radiation-sensitive material deposited over a semiconductor substrate utilizing an imaging tool, said pattern including a feature having first and second edges, each of said first and second edges having associated edge gradients, said first and second edges being spaced in close proximity to one another such that said associated edge gradients interact causing said feature to be distorted in said radiation-sensitive material, an improved method comprising the steps of:
  a) providing a first rectilinear mask image segment, said first rectilinear mask image segment having a first set of mask edges, all opposing mask edges in said first set of mask edges being spaced a distance greater than the Rayleigh limit of said imaging tool and greater than the distance between said first and second edges, a single edge from said first set of mask edges corresponding to said first edge;
  b) exposing said first rectilinear mask image segment with radiation using said imaging tool such that said single edge from said first set of mask edges produces a first pattern edge gradient defining said first edge of said two-dimensional feature in said material;
  c) providing a second rectilinear mask image segment, said second rectilinear mask image segment having a second set of mask edges, all opposing mask edges in said second set of mask edges being spaced a distance greater than said Rayleigh limit of said imaging tool and greater than said distance between said first and second edges, a single edge from said second set of mask edges corresponding to said second edge;
  d) exposing said second rectilinear mask image segment with radiation using said imaging tool such that said single edge from said second set of mask edges produces a second pattern edge gradient defining said second edge of said two-dimensional feature in said material, wherein said first and second edges are separated by distance which is less than or equal to the Rayleigh limit of said imaging tool and wherein said second pattern edge gradient and said first pattern edge gradient do not interact;
  e) developing said radiation-sensitive material, thereby reproducing said feature on said substrate.

2. The method as defined in claim 1 wherein said first and second edges are substantially parallel to each other.

3. The method as defined in claim 1 wherein said first and second edges are orthogonal.

4. The method as defined in claim 3 wherein said feature comprises a device contact of an integrated circuit, and said first and second edges define a corner of said contact.

5. The method as defined in claim 1 wherein said first and second mask image segments comprise a single mask image having an area which is larger than said two-dimensional feature.

6. The method as defined in claim 1 wherein said first mask image segment is provided on a first mask and said second mask image segment is provided on a second mask.

7. The method as defined in claim 5 wherein said mask image is rectangular in shape, and said first mask image segment is substantially parallel to said second image segment.

8. The method as defined in claim 7 wherein step (d) comprises the step of offsetting said mask image relative to said substrate.

9. The method as defined in claim 2 wherein said material comprises a negative-acting photoresist layer.

10. The method as defined in either claim 5 or 6 wherein said first and second mask image segments each have associated therewith an additional sub-resolution edge segment, each of said additional segments being spaced a predetermined distance away from, and substantially parallel to, said associated mask image segment, said additional segments functioning to increase the slope of first and second patterned edge gradients to enhance said printing of said two-dimensional feature.

11. The method as defined in claim 10 wherein said predetermined distance is approximately 1.1 times the Rayleigh limit of said imaging tool.

12. In a process for fabricating semiconductor devices, including a method of lithographically printing a rectangular feature on a mask into a photoresist layer deposited over a semiconductor substrate utilizing an imaging tool, said rectangular feature having at least two opposing feature edges each having associated edge gradients, said at least two opposing feature edges being spaced such that said associated edge gradients interact causing said feature to be distorted in said photoresist layer, an improved method comprising the steps of:
  decomposing said rectangular feature into a rectangular mask image having a pair of opposing mask edges of a length which is greater than or equal to the length of said opposing feature edges, said opposing mask edges being spaced apart a predetermined distance which is greater than the spacing between said opposing feature edges and greater than the Rayleigh limit of said imaging tool;
  exposing a first one of said pair of opposing mask edges with radiation using said imaging tool to produce a first pattern edge gradient which defines a first one of said feature edges in said photoresist layer;
  offsetting said rectangular mask image relative to said substrate;
  exposing the second one of said pair of opposing mask edges with radiation using said imaging tool to produce a second pattern edge gradient defining the second one of said feature edges in said photoresist layer, wherein said spacing between said opposing feature edges is less than or equal to the Rayleigh limit of said imaging tool and wherein said second pattern edge gradient and said first pattern edge gradient do not interact.

13. The method as defined in claim 12 wherein said predetermined distance is greater than said Rayleigh limit.

14. The method as defined in claim 13 wherein said offsetting step offsets said mask image a distance approximately equal to said predetermined distance minus said spacing.

15. The method as defined in claim 13 wherein said rectangular feature is a square.

16. The method as defined in claim 13 wherein said decomposing step includes the step of calculating the length of said mask edges as having a minimum dimension, D, which is given by the equation $$D = S + (\lambda/NA)$$

where S is the length of said feature edges, $\lambda$ is the wavelength of said radiation, and NA is the numerical aperture of said imaging tool.

17. The method as defined in claim 12 wherein said pair of mask edges each have associated therewith an additional sub-resolution edge segment, each of said additional segments being spaced a certain distance away from, and substantially parallel to, said associated mask edge, said additional segments functioning to increase the slope of said first and second pattern edge gradients, thereby enhancing said printing of said rectangular feature.

18. The method ad defined in claim 17 wherein said certain distance is approximately 1.1 times said Rayleigh limit.

19. The method as defined in claim 14 wherein said photoresist comprises a negative-acting resist layer.

20. A process for fabricating an integrated circuit (IC) on a silicon substrate using a lithographic tool, an imaging decomposition algorithm for printing an array of square contacts having an edge dimension which is less than or equal to the Rayleigh limit of said lithographic tool comprising the steps of:

(a) calculating a minimum critical dimension (CD) for said printing process based on said edge dimension;

(b) forming a plurality of decomposed image squares, each of which corresponds to one of said contacts within said array, said image squares having a dimension which is greater than or equal to said minimum CD;

(c) calculating the minimum horizontal, vertical and diagonal pitches required between adjacent contacts within said array based upon a process of decomposing each of said contacts by sequentially exposing each edge of said image squares with radiation to produce the corresponding edge of said contacts on said substrate, said squares being offset relative to said substrate prior to each subsequent exposure in said sequence to align each of said image square edges to said corresponding edges of said contacts;

(d) identifying as belonging to a first set of contacts, which of said adjacent contacts in said array violates said pitches, said contacts which are not identified as belonging to said first set being included in a second set;

(e) forming a first decomposed image mask comprising the image squares corresponding to said second set of said contacts; and (f) forming a second decomposed image mask comprising the image squares corresponding to said first set of said of contacts.

21. The algorithm as defined in claim 20 wherein said critical dimension is defined by the equation $$CD = S + (\lambda/NA)$$

where S is the length of said edges of said contacts, $\lambda$ is the wavelength of said radiation, and NA is the numerical aperture of said lithographic tool.

22. The algorithm as defined in claim 21 wherein said minimum horizontal and vertical pitches are equal to said minimum critical dimension, and said minimum diagonal pitch is defined as M, where M is by the equation $$M = \sqrt{2} \, (\lambda/NA).$$

* * * * *

(12) EX PARTE REEXAMINATION CERTIFICATE (7573rd)
United States Patent
Chen et al.

(10) Number: US 5,340,700 C1
(45) Certificate Issued: Jun. 29, 2010

(54) METHOD FOR IMPROVED LITHOGRAPHIC PATTERNING IN A SEMICONDUCTOR FABRICATION PROCESS

(75) Inventors: Jang F. Chen, San Jose, CA (US); James A. Matthews, Milpitas, CA (US)

(73) Assignee: ASML Masktools Netherlands B.V., Veldhoven (NL)

Reexamination Request:
No. 90/007,623, Jul. 12, 2005

Reexamination Certificate for:
Patent No.: 5,340,700
Issued: Aug. 23, 1994
Appl. No.: 08/149,122
Filed: Nov. 3, 1993

Related U.S. Application Data

(63) Continuation of application No. 07/863,791, filed on Apr. 6, 1992, now abandoned.

(51) Int. Cl.
*G03F 7/02* (2006.01)

(52) U.S. Cl. .................. 430/312; 430/313; 430/319; 430/311

(58) Field of Classification Search .................. None
See application file for complete search history.

(56) References Cited

U.S. PATENT DOCUMENTS 4,426,584 A * 1/1984 Bohlen et al. ............ 250/492.2
4,440,493 A * 4/1984 Hiraga ........................ 355/86
4,902,899 A * 2/1990 Lin et al. ................. 250/492.1
5,418,093 A * 5/1995 Asai et al. ....................... 430/5

FOREIGN PATENT DOCUMENTS

| EP | 0136672 A2 * | 4/1985 |
| JP | 56-160037 | 12/1981 |
| JP | 3-1522 | 1/1991 |

OTHER PUBLICATIONS

Meyerhofer "Resolution and Proximity Effect in Optical Lithography" 1988, pp. 174–187.*
Bajuk et al., IBM Technical Disclosure Bulletin,"Method for Generating Structures Smaller Than Normal Resolution Limit", Aug. 1989.*
International Search Report for PCT/US93/03126.*

* cited by examiner

*Primary Examiner*—Jerry D. Johnson

(57) ABSTRACT

A method of printing a sub-resolution device feature having first and second edges spaced in close proximity to one another on a semiconductor substrate includes the steps of first depositing a radiation-sensitive material on the substrate, then providing a first mask image segment which corresponds to the first edge. The first mask image segment is then exposed with radiation using an imaging tool to produce a first pattern edge gradient. The first pattern edge gradient defines the first edge of the feature in the material.

A second mask image segment is then provided corresponding to the second feature edge. This second mask image segment is exposed to radiation to produce a second pattern edge gradient which defines the second edge of the feature. Once the radiation-sensitive material has been developed, the two-dimensional feature is reproduced on the substrate.

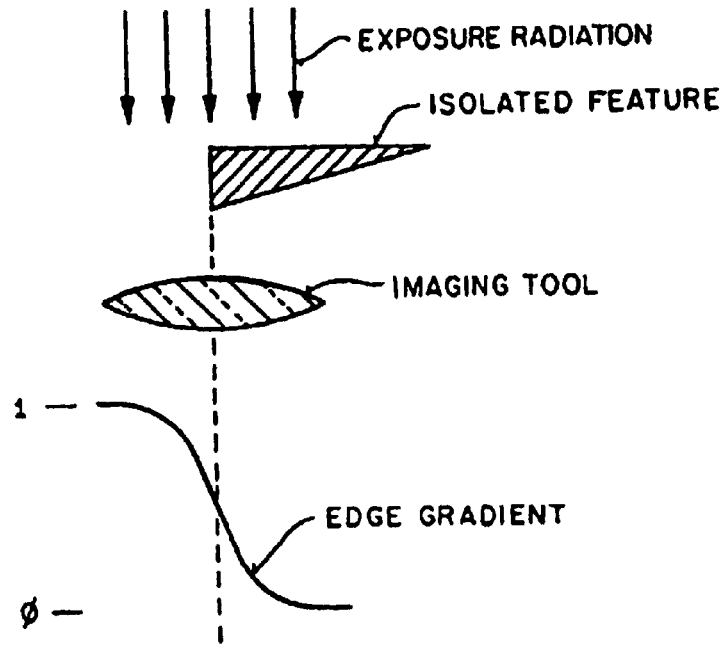

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1–22 are cancelled.

* * * * *